United States Patent
Breivogel et al.

[11] Patent Number: 6,083,089
[45] Date of Patent: *Jul. 4, 2000

[54] METHOD AND APPARATUS FOR CHEMICAL MECHANICAL POLISHING

[75] Inventors: Joseph R. Breivogel, Aloha; Matthew J. Prince; Christopher E. Barns, both of Portland, all of Oreg.

[73] Assignee: Intel Corporation, Santa Clara, Calif.

[ * ] Notice: This patent issued on a continued prosecution application filed under 37 CFR 1.53(d), and is subject to the twenty year patent term provisions of 35 U.S.C. 154(a)(2).

[21] Appl. No.: 08/909,348

[22] Filed: Aug. 11, 1997

Related U.S. Application Data

[60] Continuation of application No. 08/465,919, Jun. 6, 1995, which is a division of application No. 08/103,918, Aug. 6, 1993, abandoned.

[51] Int. Cl.$^7$ ...................................................... B24B 5/00
[52] U.S. Cl. ............................................................ 451/287
[58] Field of Search .................................... 451/285, 286, 451/287, 398

[56] References Cited

U.S. PATENT DOCUMENTS

| | | | |
|---|---|---|---|
| 2,466,610 | 4/1949 | Newman | 51/217 |
| 3,233,370 | 2/1966 | Best et al. | 51/131 |
| 3,374,582 | 3/1968 | Boetcher | 51/131 |
| 4,193,226 | 3/1980 | Gill, Jr. et al. | 51/124 |
| 4,519,168 | 5/1985 | Cesna | 51/216 |
| 4,521,995 | 6/1985 | Sekiya | 51/235 |
| 4,897,966 | 2/1990 | Takahashi | 51/131.3 |
| 4,918,870 | 4/1990 | Torbert et al. | 51/131.3 |
| 4,944,836 | 7/1990 | Beyer et al. | 156/645 |
| 5,081,795 | 1/1992 | Tanaka et al. | 51/131.1 |
| 5,084,071 | 1/1992 | Nenadic et al. | 51/309 |
| 5,127,196 | 7/1992 | Morimoto et al. | 51/165.73 |
| 5,205,082 | 4/1993 | Shendon et al. | 51/283 R |
| 5,216,843 | 6/1993 | Breivogel et al. | 51/131.1 |
| 5,267,418 | 12/1993 | Currie et al. | 51/216 R |
| 5,377,451 | 1/1995 | Leoni et al. | 451/287 |
| 5,441,444 | 8/1995 | Nakajima | 451/289 |
| 5,449,316 | 9/1995 | Strasbaugh | 51/287 |

FOREIGN PATENT DOCUMENTS

| | | |
|---|---|---|
| 1-188265 | 7/1989 | Japan . |
| 5-31660A | 2/1993 | Japan . |

*Primary Examiner*—Joseph M. Gorski
*Attorney, Agent, or Firm*—Blakely, Sokoloff, Taylor & Zafman LLP

[57] ABSTRACT

A novel method and apparatus for uniformly polishing thin films formed on a semiconductor substrate. A substrate is placed face down on a moving polishing pad so that the thin film to be polished is placed in direct contact with the moving polishing pad. The substrate is forcibly pressed against the polishing pad with pneumatic or hydraulic pressure applied to the backside of the substrate during polishing. Additionally, a wear ring is placed on the polishing pad around and adjacent to the substrate and forcibly pressed onto the polishing pad with a downward pressure from a second source so that the wear ring is coplanar with the substrate in order to eliminate edge rounding effects.

9 Claims, 4 Drawing Sheets

METHOD AND APPARATUS FOR CHEMICAL MECHANICAL POLISHING

This is a continuation of application Ser. No. 08/465,919, filed Jun. 6, 1995, now abandoned, which is a divisional of application Ser. No. 08/103,918, filed Aug. 6, 1993, and now abandoned.

BACKGROUND OF THE INVENTION

1. Field of the Invention

The present invention relates to the field of semiconductor manufacturing and, more specifically, to an improved method and apparatus for chemical-mechanical polishing.

2. Description of Relevant Art

Integrated circuits manufactured today are made up of literally millions of active devices such as transistors and capacitors formed in a semiconductor substrate. Integrated circuits rely upon an elaborate system of metalization in order to connect the active devices into functional circuits. A typical multilevel interconnect 100 is shown in FIG. 1. Active devices such as MOS transistors 107 are formed in and on a silicon substrate or well 102. An interlayer dielectric (ILD) 104, such as $SiO_2$, is formed over silicon substrate 102. ILD 104 is used to electrically isolate a first level of metalization which is typically aluminum from the active devices formed in substrate 102. Metalized contacts 106 electrically couple active devices formed in substrate 102 to the interconnections 108 of the first level of metalization. In a similar manner metal vias 112 electrically couple interconnections 114 of a second level of metalization to interconnections 108 of the first level of metalization. Contacts and vias 106 and 112 typically comprise a metal 116 such as tungsten (W) surrounded by a barrier metal 118 such as titanium-nitride (TiN). Additional ILD/contact and metalization layers can be stacked one upon the other to achieve the desired interconnection.

A considerable amount of effort in the manufacturing of modern complex, high density multilevel interconnections is devoted to the planarization of the individual layers of the interconnection structure. Nonplanar surfaces create poor optical resolution of subsequent photolithographic processing steps. Poor optical resolution prohibits the printing of high density lines. Another problem with nonplanar surface topography is the step coverage of subsequent metalization layers. If a step height is too large there is a serious danger that open circuits will be created. Planar interconnect surface layers are a must in the fabrication of modern high density multilevel integrated circuits.

To ensure planar topography, various planarization techniques have been developed. One approach, known as chemical-mechanical polishing, employs polishing to remove protruding steps formed along the upper surface of ILDs. Chemical-mechanical polishing is also used to "etch back" conformally deposited metal layers to form planar plugs or vias. In a typical chemical-mechanical polishing method, as shown in FIG. 2a, a silicon substrate or wafer 202 is placed face down on a rotating table 204 covered with a flat polishing pad 206 which has been coated with an active slurry 208. A carrier 200, which is typically made of thick nonflexible metal plate 214, is used to apply a downward force $F_1$ from shaft 205 against the backside of substrate 202. A retaining ring 217 centers wafer 202 on carrier 200 and prevents it from slipping laterally. It is to be noted that retaining ring 217 is not in contact with polishing pad 206 during polishing. The backside of wafer 202 is typically pressed by a resilient carrier pad 212. The downward force $F_1$ and the rotational movement of pad 206 together with the slurry facilitate the abrasive polishing and planar removal of the upper surface of the thin film. Carrier 200 is typically rotated by spinning shaft 205 to enhance polishing.

A problem associated with carrier 200 is the unequal polishing pressure distribution which can develop across the surface of wafer 202. Wafer 202 is pressed down by nonflexible metal plate 214 of carrier 200. Mechanics dictates that the integration of pressure of all of the areas of the front side of wafer 202 must equal the downward force applied to carrier 200. Therefore, in carrier 200, the pressure at any point on wafer 202 is controlled by the local compressive modulus (hardness) and local compression of polishing pad 206 and carrier pad 212. Any variation in the amount of compression of carrier pad 212 or polishing pad 206 results in local pressure variations. With carrier 200 any nonuniformities in wafer thickness and/or surface irregularities on wafer carrier 200 or polishing table 204 can create local pressure variations across the surface of wafer 202.

It is generally understood that the polish removal rate in chemical-mechanical polishing is directly proportional to the pressure (lbs/in$^2$) applied between the wafer and the polishing pad in the direction perpendicular to the polishing motion. The greater the pressure, the greater the polish removal rate. Thus, nonuniform pressure distribution across the surface of wafer 202 creates a nonuniform polish rate across the surface of wafer 202. Nonuniform polishing can result in too much film being removed from some parts of wafer 202 and not enough film being removed from other parts. Nonuniform polishing can cause the formation of overly thin films and/or result in insufficient planarization, both of which degrade process yield and reliability. It is to be appreciated that chemical-mechanical polishing with a nonuniform polish rate is manufacturably unacceptable in the fabrication of today's high density, multi-level integrated circuits.

Another problem associated with present polishing techniques and wafer carrier 200 is the "edge rounding" effects which can result due to polishing pad bending. When wafer 202 is forcibly pressed against pad 206 during polishing, pad 206 compresses under wafer 202 and a bend 207 forms in pad 206 near the outer edge of wafer 202. The bend 207 causes a substantial increase in pressure along the very outer (approximately 0.1 inch) edge 216 of wafer 202. A high pressure area 216 is created where the bent pad touches wafer 202. Additionally, as a consequence of fundamental mechanical principles, a lower than normal polishing pressure area 218 is created directly inside high pressure area 216. Lower polishing pressure area 218 generally effects about the half inch diameter inside high pressure area 216 of wafer 202. A generally uniform polish pressure normally results over the remainder or center 220 of wafer 202. The polishing pressure discontinuity across the surface of wafer 202 due to pad bend 207 causes wafer 202 to have a relatively uniform thickness in the central region 220, surrounded by a substantially thicker region 218 which in turn is surrounded by a very thin outside edge 216. Essentially a thick ring is formed around the outside radius of wafer 202 when carrier 200 is used. FIG. 2b illustrates the polishing pressure distribution across the surface of wafer 202 when wafer carrier 200 is used.

Still yet another problem associated with wafer carrier 200 is that polish uniformity can be effected by "pad wear". As polishing pad 206 is used to polish a number of wafers, the initial flat surface becomes concave due to wear by the wafer's surface. A concave pad surface creates a nonuniform pressure distribution across the wafer diameter. A low pressure area is created at the center of the wafer where wear is greatest and a high pressure area is created on the outside area of the wafer where pad wear is the least. The effect is that the polishing removal rate decreases from the outside edge of the wafer to the center of the wafer. Shaped carriers have been proposed to counteract the concavity of the polishing pad. The manufacturing of shaped carriers, however, requires substantial skill as well as the ability to determine exactly what shape will create the most uniform wafers. Additionally, since pad surface topography changes over time, so must the shape of the carrier in order to provide a uniform polishing. As is expected, use of a shaped carrier is manufacturably inadequate to remedy the problems associated with pad wear.

Thus, what is needed is a novel method and apparatus for chemical-mechanical polishing a thin film formed on a semiconductor substrate where a uniform polish pressure is provided across the surface of the wafer regardless of polishing pad or table irregularities.

SUMMARY OF THE INVENTION

A novel method and apparatus for uniformly polishing thin films formed on a semiconductor substrate is described. A substrate is placed face down on a moving polishing pad so that the thin film to be polished is placed in direct contact with the moving polishing pad. The substrate is forcibly pressed down against the polishing pad by a first amount of pneumatic pressure applied directly to a substantial portion of the backside of the substrate during polishing. A wear ring adjacent to and surrounding the outer edge of the substrate is forcibly pressed down against the polishing pad with a second pressure applied from a mechanical force wherein the second pressure is approximately equal to the pneumatic pressure applied to the backside of the substrate during polishing. The substrate can be rotated during polishing to help facilitate uniform polishing. In an embodiment of the present invention the wear ring and the substrate are each forcibly pressed against the polishing pad by the same pneumatic or hydraulic source.

An object of the present invention is to provide a method of chemical-mechanical polishing which is not dependent on variations in wafer thickness and table or carrier irregularities.

Another object of the present invention is to provide a method of chemical-mechanical polishing thin films formed on a wafer wherein a uniform polish pressure is provided across the surface of the wafer.

Still another object of the present invention is to provide a method of chemical-mechanical polishing which eliminates edge-rounding effects caused by polishing pad compression.

Still yet another object of the present invention is to provide a method of chemical-mechanical polishing which counteracts the effects of pad wear over time.

Still other objects and advantages of the present invention will become obvious from the detailed description which follows.

DETAILED DESCRIPTION OF THE PRESENT INVENTION

An improved method and apparatus for the chemical-mechanical polishing of thin films formed on a semiconductor substrate is described. In the following description numerous specific details are set forth, such as specific equipment and materials, etc., in order to provide a thorough understanding of the present invention. It will be obvious, however, to one skilled in the art that the present invention may be practiced without these specific details. In other instances, well-known machines and chemical-mechanical process steps have not been described in particular detail in order to avoid unnecessarily obscuring the present invention.

Figure 1:
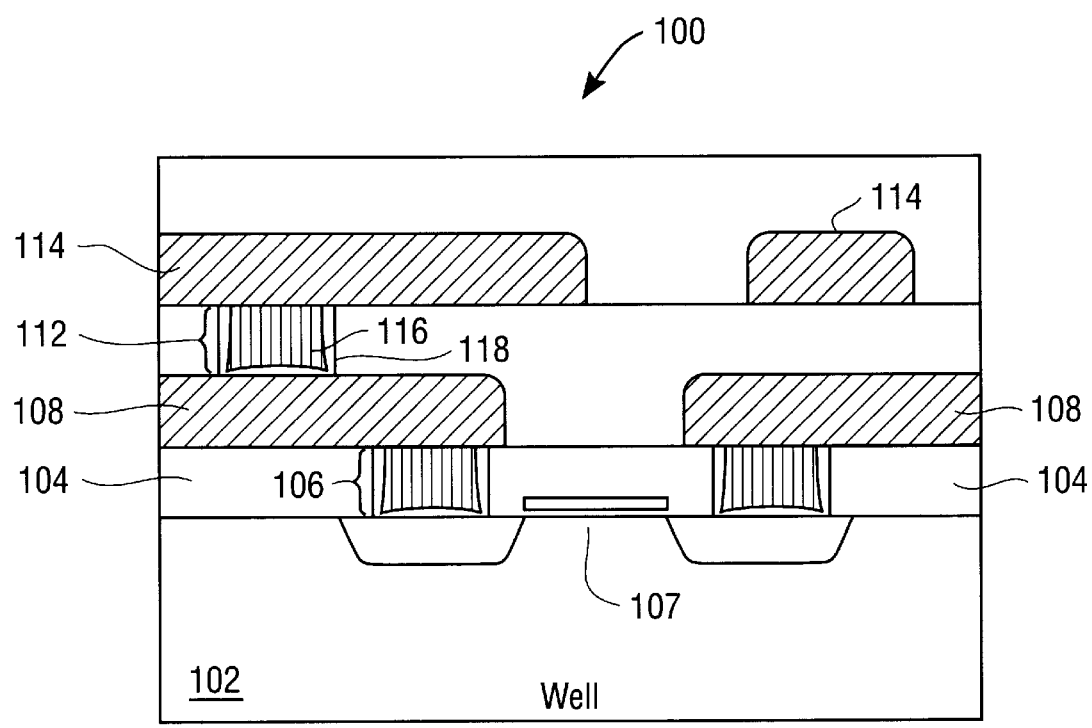
FIG. 1 is a cross-sectional illustration of a multilevel interconnect structure formed on a silicon substrate.
Figure 2:
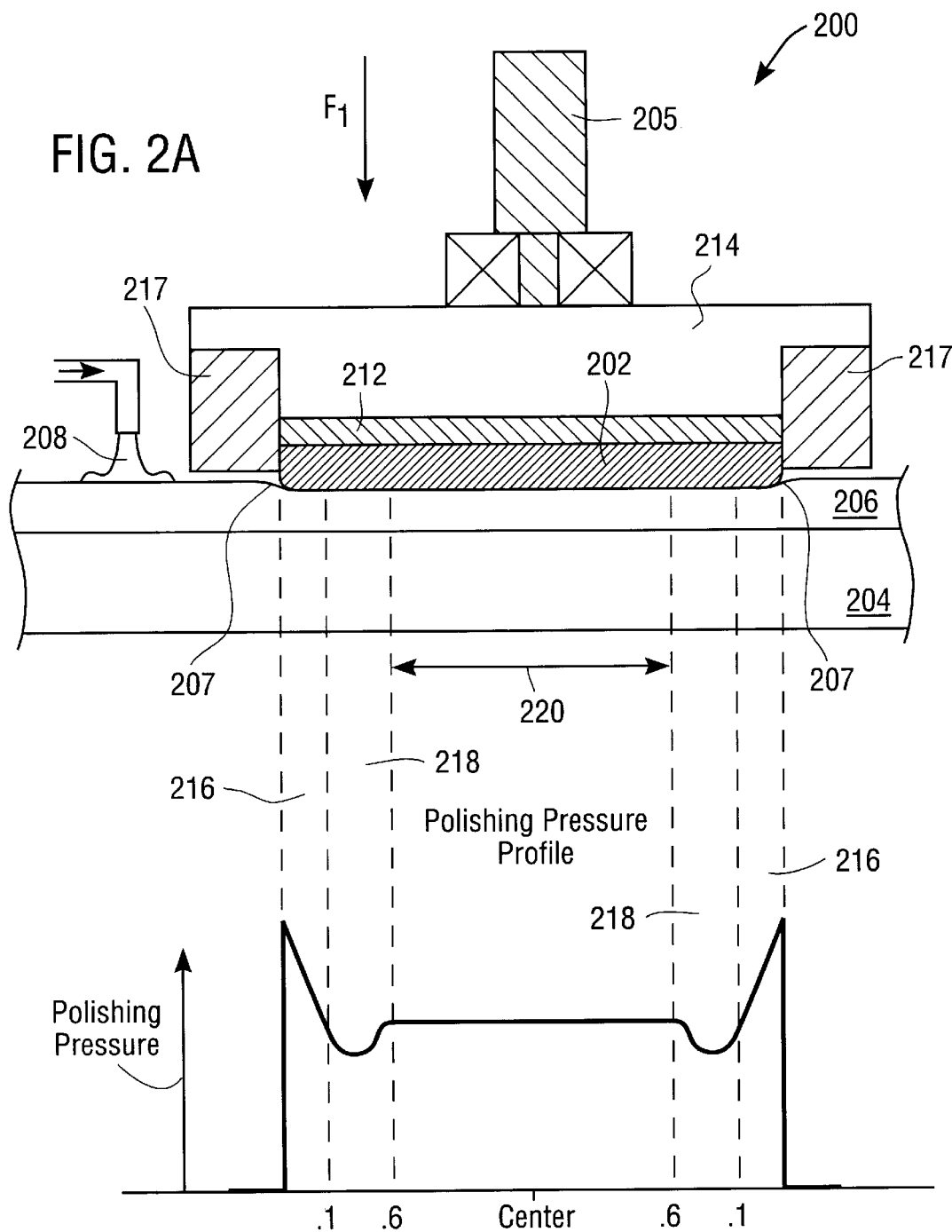
FIG. 2a is a cross-sectional illustration of a wafer carrier presently used in chemical-mechanical polishing.
FIG. 2b is an illustration of polishing pressure distribution across the surface of a wafer when the carrier of FIG. 2a is used in chemical-mechanical polishing.
Figure 3:
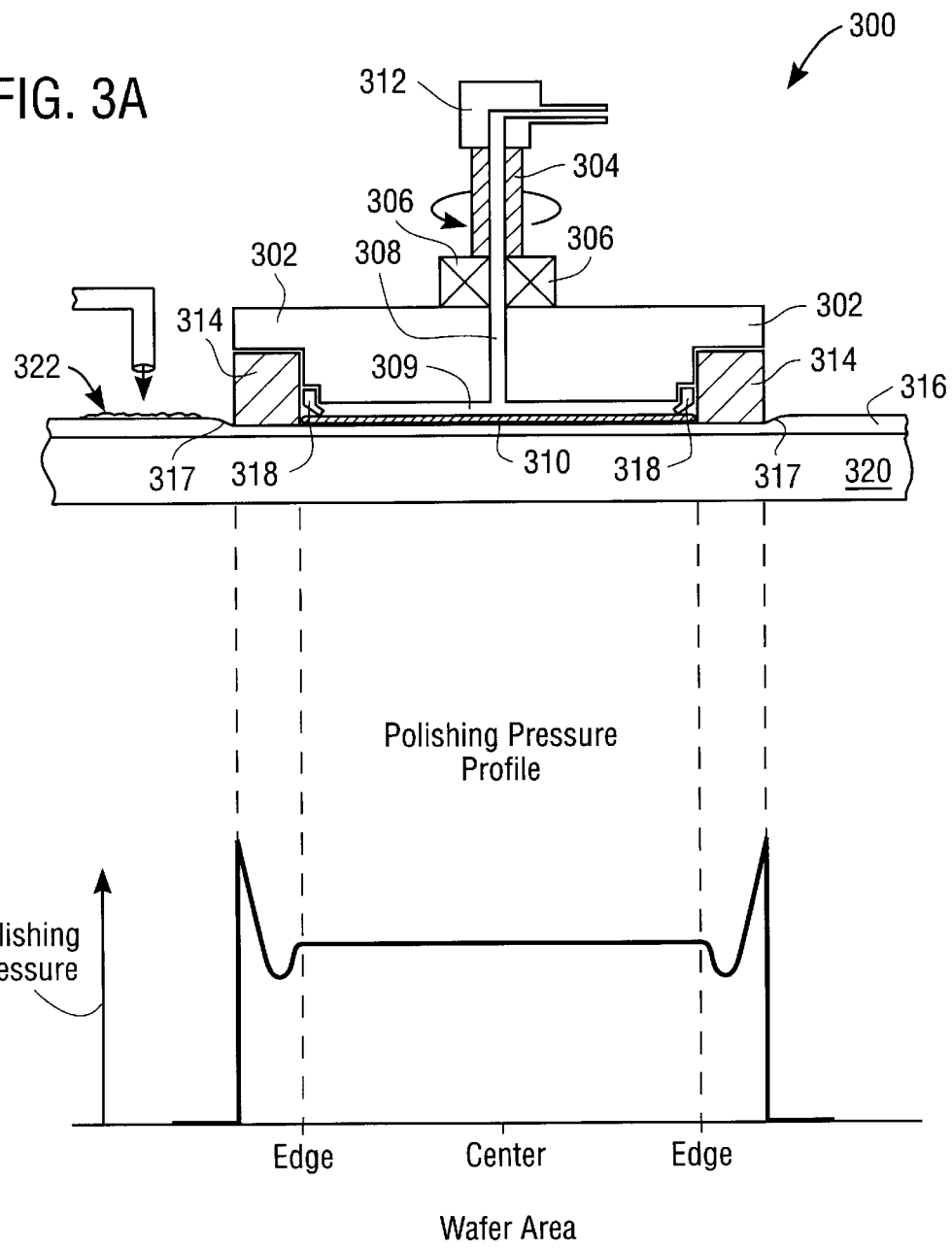
FIG. 3a is a cross-sectional illustration of an embodiment of an improved wafer carrier of the present invention.
FIG. 3b is an illustration of polishing pressure distribution across the surface of a wafer when the carrier of FIG. 3a is used in chemical-mechanical polishing

The present invention describes novel chemical-mechanical polishing techniques which can be used to generate a uniform polishing pressure across the surface of a wafer being polished. FIG. 3a represents a cross-sectional illustration of an improved wafer or substrate carrier 300 which can be used in the chemical-mechanical polishing process of the present invention. Wafer carrier 300 has a circular stainless steel base 302 attached to a steel rotatable drive shaft 304 by a flexible coupling 306, such as a gimble, to correct for angular misalignments. Drive shaft 304 is hollow to allow pneumatic pressure to be conveyed through passage 308 into chamber 309 created above the backside of wafer 310 and below base 302. A rotating union 312 couples shaft 304 to an air pressure supply (not shown) such as a compressor. Rotary union 312 allows air pressure to be injected through shaft 304 and base 302 as they rotate during polishing. A wear-resistant retaining ring 314 of, for example, ceramic, plastic, or composite materials, is attached to the outer diameter of the bottom of base 302. Wear ring 314 surrounds and is in contact with the outside edge of wafer 310. Wear ring 314 prevents wafer 310 from slipping laterally from carrier 300. Wear ring 314 rides in direct contact with the upper surface of polishing pad 316 and provides vertical loading on polishing pad 316. A resilient lip seal 318 is attached just inside wear ring 314 and covers approximately the outer 10 mm diameter of wafer 310. Lip seal 318 is flexible in order to allow vertical movement of wafer 310. Lip seal 318 creates a leak-tight seal against the backside of wafer 310, the side of carrier base 302, and the inside of wear ring 314. In this way, pneumatic pressure can be maintained in chamber 309 directly against the backside of wafer 310 and maintain a uniform downward force. A characteristic of lip seal 318 is that increasing air pressure causes lip seal 318 to form an even stronger seal.

In a chemical-mechanical polishing process of the present invention utilizing wafer carrier 300, wafer 310 is placed face down on the upper surface of polishing pad 316 which is fixedly attached to the upper surface of table 320. In this manner the thin film to be polished on wafer 310 is placed in direct contact with polishing pad 316. Pneumatic pressure is injected through rotary union 312, rotary drive shaft 304, and passage 308 into and maintained in chamber 309 against the backside of wafer 310 during polishing. Additionally, a mechanical downward force $F_1$ is applied to rotary union 312 and shaft 304 so that wear ring 314 provides a downward pressure on pad 316. Mechanical force $F_1$ is adjusted so that wear ring 314 provides pressure on pad 316 which is approximately equal to the pneumatic pressure developed against the backside of wafer 310. In this way the bottom surface of wear ring 314 and the face of wafer 310 are substantially coplanar during polishing. An abrasive slurry 322 is deposited onto the upper surface of polishing pad 316 during polishing. Grooves can be formed in pad 316 to help transport slurry to the wafer/pad interface. Pad 316 and table 320 can be rotated by well-known means such as by a belt and a variable speed motor. In a similar manner carrier 300 can be rotated during polishing by rotating shaft 304. Polishing is facilitated by slurry together with the rotational movement of pad 316 relative to wafer 310 as between 2–12 lbs/in$^2$ of pneumatic pressure is applied to the backside of wafer 310 and between 2–12 lbs/in$^2$ of mechanical pressure is applied by wear ring 314. It is to be appreciated that pad 316 need not necessarily be rotated but may move in other directions such as described in copending U.S. patent application Ser. No. 08/103,412 filed Aug. 6, 1993 and assigned to the present assignee. Polishing is continued in this manner until the desired amount of thin film has been removed or the desired amount of planarity has been achieved.

An important feature of the present invention is the use of pneumatic (air) pressure to forcibly press wafer 310 against polishing pad 316 during polishing. Pneumatic pressure provides a uniform pressure distribution against the backside of wafer 310. With pneumatic pressure the polishing pressure across the wafer surface is no longer indirectly controlled by polishing pad compressibility and deflection. This is because pneumatic pressure allows wafer 310, which is somewhat flexible, to slightly bend to conform with any irregularities in the polish pad or polish table. Pneumatic pressure provides uniform polishing pressure distribution across the surface of a wafer independent of the polishing pad, wafer, table, or carrier irregularities. Since carrier 300 provides a uniform polish pressure across the surface of wafer 310, the polish removal rate is uniform across the surface of wafer 310. It is to be appreciated that hydraulic pressure can be used in place is pneumatic pressure in the present invention and similar results obtained.

Another advantage of using pneumatic pressure is that it compensates for polishing removal nonuniformity due to pad wear. As mentioned earlier, as polishing pad 316 becomes worn with use, a concave depression is formed in the top surface of pad 316. The concave depression decreases the polishing pressure towards the center of wafer 310 and thereby reduces the polish removal rate at the center of wafer 310. With pneumatic pressure behind wafer 310, the somewhat flexible wafer 310 can bend to conform to the concave shape, and thereby remain in contact with pad 316 under substantially the same pressure. In this way, the polish removal rate across the surface of wafer 310 remains uniform even as pad 316 becomes somewhat worn. This increases wafer throughput and decreases costs by allowing more wafers to be uniformly and reliably polished per pad.

Another important feature of the present invention is the fact that wafer 310 floats relative to the bottom plane of wear ring 314 during polishing. By surrounding the outer edge of wafer 310 with wear ring 314 and by keeping the polishing surface of wafer 310 substantially coplanar with the bottom surface of wear ring 314, "edge rounding" is eliminated. During polishing, wear ring 314 and wafer 310 compress pad 316. The bend of pad 316 in the present invention is at the outer edge of wear ring 314. In this way, the high pressure area resulting from the pad bend 317 is below wear ring 314. Additionally, the low pressure area which directly follows the high pressure area is also positioned beneath wear ring 314. It is to be appreciated that wear ring 314 is extended a distance past the outer edge of wafer 310 greater than that distance normally effected by edge rounding, which is typically the outer 0.6 inch diameter. In essence edge rounding is eliminated from wafer 310 because wear ring 314 acts as an extension of wafer 310, moving the polishing pressure nonuniformities associated with pad bending 317 outside of wafer 310. FIG. 3b illustrates the polish pressure distribution across the surface of wafer 310 when carrier 300 is used and is properly loaded. As shown in FIG. 3b, the polishing pressure is uniform across the entire wafer surface.

It is to be appreciated that the precise amount of wear ring pressure applied to pad 316, relative to the polishing pressure applied by wafer 310, strongly effects the edge rounding behavior. By using optimum wear ring pressure relative to polishing pressure, polish uniformity can be provided from the center to the edge of wafer 310. A lower pressure on wear ring 314 increases the pressure at the edge of wafer 310 and thereby causes the edge of wafer 310 to polish at a greater rate than the center of wafer 310. A higher pressure on wear ring 314 decreases the pressure at the edge of wafer 310 and thereby causes the edge of wafer 310 to polish at a lower rate than the center of wafer 310. This effect may be used to compensate for wafer or film thickness nonuniformity near the outer edge. It has been found that by applying slightly less (approximately 1 lb/in$^2$) mechanical pressure on wear ring 314 as pneumatic pressure on the back side of wafer 310, that a substantially uniform polish rate over the entire wafer surface can be achieved. This is because the outer edge of wafer 310 is not loaded as great by pneumatic pressure due to the placement of lip seal 318 around the outer 10 mm edge of wafer 310. The lower wear ring pressure compensates for the fact that a lower pneumatic pressure is applied to the outer edge of wafer 310.

Figure 4:
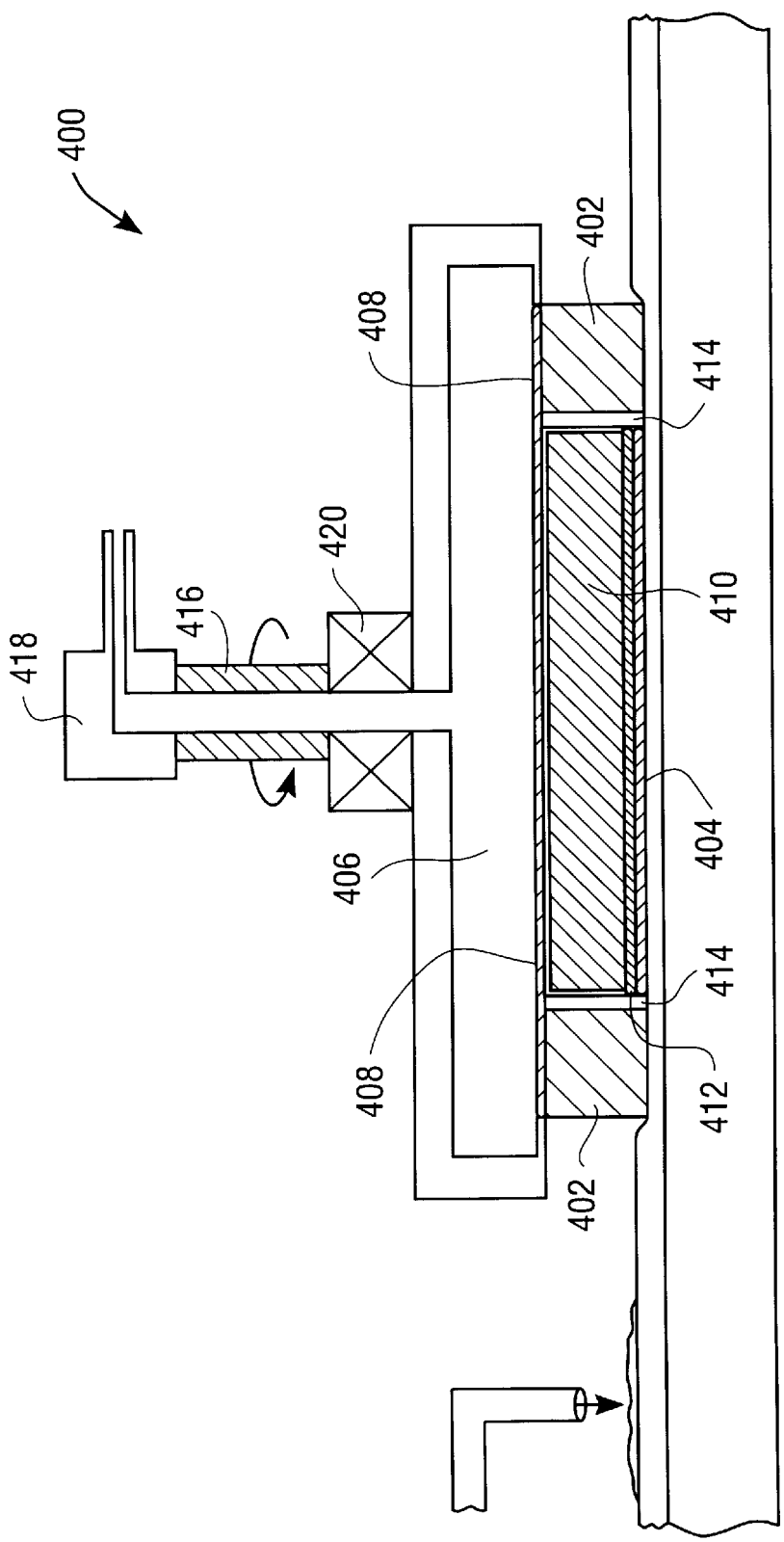
FIG. 4 is a cross-sectional illustration of an alternative embodiment of an improved wafer carrier of the present invention.

An alternative wafer carrier which can be used in the present invention is shown in FIG. 4. Wafer carrier 400 has features similar to those of wafer carrier 300. As with wafer carrier 300, wafer carrier 400 uses pneumatic pressure to provide a polishing pressure onto the back side of the wafer to be polished. Additionally, like wafer carrier 300, wafer carrier 400 utilizes a wear ring 402 which is adjacent to and surrounds the outer edge of the wafer to be polished and which is coplanar with the surface of the wafer to be polished in order to eliminate "edge rounding" effects. In carrier 400 a sealed chamber 406 is created above wear ring 402 and wafer 404. A flexible backing diaphragm 408 of, for example, stainless steel, plastic, or rubber, etc., is used to transfer the pneumatic pressure developed in chamber 406 to wear ring 402 and to wafer 404. A circular backing plate 410 transfers the pneumatic pressure applied to diaphragm 408 to the backside of wafer 404. Backing plate 410 can be a flexible material such as rubber or plastic, but may also be a rigid material such as stainless steel. It is to be appreciated that pressure uniformity improvement of carrier 400 is not as great as carrier 300 because pneumatic or hydraulic pressure is not applied directly to the back of the wafer as with carrier 300. Backing plate 410 can float up and down to adjust to wafer thickness variations. A foam rubber backing pad 412 such as a DF200 pad manufactured by Rodel Inc., is placed between the backside of wafer 404 and steel plate 408 to cushion wafer 404 from backing plate 408. A plastic edge band 414 can be attached to the inside surface of wear ring 402 adjacent to the outer edge of wafer 404. Plastic edge band 414 cushions the edge of wafer 404 from wear ring 402 and thereby prevents wafer edge chipping during polishing.

An important feature of wafer carrier 400 is that uniform pneumatic (or hydraulic) pressure is applied by diaphragm 408 to both wafer 404 and to wear ring 402. In this way a polishing pressure and an edge rounding compensation pressure are simultaneously applied to wafer 404 and wear ring 402, respectively. This technique provides a manufacturably repeatable loading technique of wafer 404 and wear ring 402. It is to be appreciated that, like carrier 300, a hollow rotatable shaft 416 and a rotary union 418 are provided so as to allow carrier 400 to be rotated during polishing while pneumatic pressure is injected into chamber 406. Additionally, a flexible coupling 420, such as a gimble, can be used to allow carrier 400 to adjust for any angular misalignments during polishing.

Normally the techniques of the present invention are used to planarize a thin film layer formed over a semiconductor substrate. In a typical use the thin film is an interlayer dielectric (ILD) such as $SiO_2$ formed over and between two metal layers of a semiconductor device. In another use the thin film is a metal such as tungsten which has been conformally deposited onto a ILD and into via openings which is then polished back to form planar plugs or vias. The thin film, however, need not necessarily be an ILD or a metal for a plug, but can be any one of a number of thin films used in semiconductor integrated circuit manufacturing such as, but not limited to, metal interconnection layers, organic layers, and even the semiconductor material itself. In fact, the method and apparatus of the present invention can be generally applied to any polishing process which uses similar equipment and where polishing pressure uniformity across the surface of the material to be polished is influenced by pad compressibility and deflection. For example, the present invention may be useful in the manufacture of metal blocks, plastics, and glass plates, etc.

It is to be appreciated that the polishing pad can be made up of a variety of materials. For example, in the planarization of an oxide based interlayer dielectric, the pad can be a relatively hard polyurethane or similar material. In the polishing of a metal such as tungsten, for example, in the etchback step of a plug formation process, the pad can be a urethane impregnated felt pad. Additionally, a wide variety of well-known slurries can be used for polishing. The actual composition of the slurry depends upon the specific material to be polished Slurries are generally silica based solutions which have additives dependent upon the type of material to be polished. A slurry known as SC3010 which is manufactured by Cabot Inc. can be utilized to polish oxide ILDs. Additionally, a slurry comprising potassium ferricyanide and cellodial silica with a pH adjusted to a value of less than 6.2 can be used in the polishing of tungsten metal layers. Slurry can be provided directly to the wafer/pad interface as described in Copending U.S. patent application Ser. No. 08/103,412, filed Aug. 6, 1993 and assigned to the same Assignee. Additionally, because the polishing pad can become worn and unable to deliver slurry particles to the wafer/pad interface during polishing, a pad conditioning apparatus may be needed to restore the proper pad surface roughness to deliver slurry. Such a conditioning apparatus is described in U.S. Pat. No. 5,216,843 entitled: Polishing Pad Conditioning Apparatus For Wafer Planarization Process, assigned to the present assignee.

Novel chemical-mechanical polishing techniques have been described. The novel chemical-mechanical polishing techniques of the present invention help to create a uniform polish pressure across the surface of a wafer being polished. It is to be appreciated that a number of different techniques such as the use of pneumatic pressure and a wear ring for providing uniform polishing pressure have been described. The different techniques of the present invention can be used independently, or in combination with one another, or in combination with other well-known techniques to improve polishing pressure uniformity without departing from the scope of the present invention.

As such, novel methods and apparatuses for providing a substantially uniform polish pressure across the surface of a wafer have been described.

What is claimed is:

1. A wafer carrier comprising:

a base defining a fluid flow passage therethrough;

a retaining ring extending from said base, said retaining ring defining a wafer location opening capable of receiving a wafer so that said wafer is restricted from movement by an inner surface of said retaining ring; and a seal ring, in said wafer location opening, which circumferentially seals with said base, said seal ring being made of flexible resilient material and being located entirely within said wafer location opening at least upon depression of a sealing edge of said seal ring into said wafer location opening, said base and said seal ring defining a chamber into which a fluid can be introduced through said fluid flow passage.

2. The carrier of claim 1 wherein the retaining ring has a surface, distant from said base, which is substantially planar with a surface of said wafer, opposing said seal ring, when said wafer is located within said opening.

3. The carrier of claim 1 further comprising a shaft coupled to said base, said shaft being capable of rotating the wafer during polishing.

4. The carrier of claim 3 wherein said shaft is capable of moving said retaining ring.

5. The carrier of claim 3 wherein said shaft has a fluid injection passage in communication with said opening in said base.

6. The carrier of claim 3 further comprising means for coupling said shaft to said base, said means allowing angular movement of said base during polishing.

7. A carrier, for a wafer, said carrier comprising:

a base having a fluid flow passage therethrough;

a structure, on said base, said structure defining an opening to receive and support said wafer about a periphery of said wafer; and a ring, in said opening, having first and second sides, said first side circumferentially sealing with said base and said second side being positioned to seal on a surface of said wafer when supported by said structure, said ring being made of a flexible, resilient material and being located entirely within said opening at least upon depression of said second side into said opening, and said base and said ring defining a chamber into which a fluid can be passed through said fluid flow passage.

8. The carrier of claim 7 wherein said ring is made from an elastomer.

9. A wafer carrier in combination with a wafer, comprising:

a base defining a fluid flow passage therethrough;

a structure, on said base, defining a wafer location opening;

a wafer located within said structure so that said structure supports said wafer about a periphery thereof; and a ring, in said wafer location opening, having a first edge which circumferentially seals with said base, said seal contacting said base in an area which is located within said structure, and a second edge which projects from the base into the wafer location opening and circumferentially seals on said wafer so that said base, said seal and said wafer define a chamber that is substantially air tight, said fluid flow passage leading into said chamber, said ring being made of a flexible resilient material and being located entirely within said opening at least upon depression of said second edge into said wafer location opening.

* * * * *